United States Patent [19]
Hooke et al.

[11] Patent Number: 5,449,434
[45] Date of Patent: Sep. 12, 1995

[54] METHOD FOR PLASMA PROCESSING AT HIGH PRESSURE

[75] Inventors: William M. Hooke; Steven P. Bozeman, both of Chapel Hill, N.C.

[73] Assignee: University of North Carolina at Chapel Hill, Chapel Hill, N.C.

[21] Appl. No.: 218,698

[22] Filed: Mar. 28, 1994

Related U.S. Application Data

[63] Continuation of Ser. No. 939,010, Sep. 2, 1992, abandoned.

[51] Int. Cl.⁶ .................. B44C 1/22; C23C 15/00; C03C 25/06
[52] U.S. Cl. .................... 216/70; 427/508; 427/553; 427/595; 156/643.1
[58] Field of Search ............. 204/298.38, 192.12; 156/345, 643, 646; 118/50.1, 620, 723; 427/508, 553, 595

[56] References Cited

U.S. PATENT DOCUMENTS

| | | | |
|---|---|---|---|
| 4,438,368 | 3/1984 | Abe et al. | 315/39 |
| 4,816,113 | 3/1989 | Yamazaki | 204/298.38 X |
| 4,831,963 | 5/1989 | Saito et al. | 118/723 |
| 4,857,809 | 8/1989 | Torii et al. | 315/111.31 |
| 4,866,346 | 9/1989 | Gaudreau et al. | 315/111.21 |
| 4,876,983 | 10/1989 | Fukda et al. | 204/298.38 X |
| 4,877,509 | 10/1989 | Ogawa et al. | 204/298 |
| 5,003,152 | 3/1991 | Matsuo et al. | 219/121.59 |
| 5,032,202 | 7/1991 | Tsai et al. | 204/298.38 X |
| 5,081,398 | 1/1992 | Asmussen et al. | 204/298.38 X |
| 5,125,358 | 6/1992 | Ueda et al. | 118/723 |

FOREIGN PATENT DOCUMENTS

3144016A1 7/1982 Germany .

OTHER PUBLICATIONS

Mantei et al., *Diamond deposition in a permanent magnet microwave electron cyclotron*, J. Vac. Sci. Technol. A 10(4), Jul./Aug. 1992, pp. 1423–1425.

Mantei et al., *Characterization of a permanent magnet electron cyclotron resonance plasma source*, J. Vac. Sci. Technol. B9(1), Jan./Feb. 1991, pp. 26–28.

Suzuki et al., "Microwave Plasma Etching", Japanese Journal of Applied Physics, vol. 16, No. 11, Nov., 1977, pp. 1979–1984.

Suzuki et al., "Microwave Plasma Etching", Vacuum, vol. 34, No. 10/11, pp. 953–957, 1984.

Hopwood et al., "Plasma Etching With A Microwave Cavity Plasma Disk Source", J. Vac. Sci. Tecnol. B6(1), Jan./Feb. 1988.

*Primary Examiner*—Nam Nguyen
*Attorney, Agent, or Firm*—Bell, Seltzer, Park & Gibson

[57] ABSTRACT

A method for plasma processing includes using a relatively high magnetic field and a relatively high pressure to create a first plasma region adjacent a window of a processing chamber having a lower radiation absorption and a second plasma region adjacent a substrate holder having a higher radiation absorption. Accordingly, a cooler plasma region is created adjacent the window to prevent contaminants from being etched from the window and adjacent chamber surface, and hotter plasma region is created adjacent the substrate to increase the processing rate. Additionally, the relatively high pressure of the processing gas, preferably greater than about 10 Torr and more preferably greater than about 100 Torr, increases the density of the plasma thereby increasing the processing rate. Alternatively, a high magnetic field and a high pressure create a radiation absorption region which is on the order of centimeters thick, for example 5–10 centimeters thick. Preferably, a uniform magnetic field creates uniform absorption in the absorption region.

9 Claims, 2 Drawing Sheets

METHOD FOR PLASMA PROCESSING AT HIGH PRESSURE

This is a continuation of application Ser. No. 08/939,010 filed Sep. 2, 1992 abandoned.

FIELD OF THE INVENTION

The present invention relates to the field of plasma assisted processing, and, more particularly, to a method for plasma assisted processing of semiconductor substrates and the like at high pressures.

BACKGROUND OF THE INVENTION

Plasma processing of semiconductor substrates and other materials, such as for etching or deposition, is typically performed in an evacuated processing chamber in which a plasma is formed in a process feed gas. Microwave radiation may typically be coupled from an external generator, through a radiation transmissive window, such as a quartz or ceramic window, and into the chamber to thereby generate a plasma from the process gas. An ECR apparatus is a typical plasma processing apparatus which operates on the well known principle of electron cyclotron resonance (ECR). Such an ECR apparatus is disclosed, for example, in U.S. Pat. No. 4,877,509 to Ogawa et al.

An ECR typically operates at relatively low pressures, such as between $10^{-7}$ to $10^{-2}$ Torr, and at a relatively low magnetic field strength of 875 Gauss for a microwave frequency of 2.45 GHz to thereby achieve electron cyclotron resonance. In other words, the low pressures mean that the plasmas are in a collision-less regime. Unfortunately, an ECR, because it operates at such low pressures, does not have a sufficiently high processing rate for many desired applications, such as, for example, the deposition of carbon atoms to form diamond semiconductor substrates and layers. Accordingly, the production throughput of such an ECR is limited and increases the cost of production.

In addition, when an ECR is operated at high power in an attempt to increase the processing rate, a relatively hot plasma region is generated adjacent the quartz window. Accordingly, the window then typically requires supplementary cooling, such as by circulating cooling water adjacent the periphery of the window. See, for example, "Plasma Etching with a Microwave Cavity Plasma Disk Source" by Hopwood et al., Journal of Vacuum Science Technology B6(1), January/February, 1988, pp. 268-271. Moreover, contaminants may be introduced into the process gas by etching of the window and adjacent chamber surfaces by the relatively hot plasma region.

A quartz tube positioned within the waveguide coupling power to the plasma has been used to reduce contamination from etching of adjacent chamber surfaces. Such a quartz tube is disclosed, for example, in U.S. Pat. No. 4,866,346 to Gaudreau et al. The use of the quartz tube, however, limits the physical size of the plasma that may be generated and the size of the substrate that may be processed.

Other general microwave and RF driven industrial plasmas are generated in a collision-dominated regime, that is, at higher pressures than ECR's and without magnetic enhancement. However, in high pressure plasma systems the power is absorbed very near the plasma surface. This surface absorption causes much of the plasma energy to diffuse to the walls of the chamber, where it is lost. Moreover, because the energy is absorbed at the surface, the gas temperatures are not uniform over a cross section of the plasma ("skin effects"). Loss of efficiency and non-uniform plasma processing result.

Magnetic fields have not been used with high pressure plasmas, because it has been assumed that a magnetic field will have no effect on a high pressure plasma because the collision frequency is higher than the radiation frequency. The collision frequency increases in a high pressure plasma system because higher pressure means larger numbers of atoms and molecules and more collisions. Accordingly, conventional theory holds that in a high pressure plasma, the large number of collisions will eliminate any effect that could be accomplished with the magnetic field.

SUMMARY OF THE INVENTION

It is therefore an object of the present invention to provide a method for obtaining a high processing rate in plasma assisted processing, such as for etching or depositing materials on semiconductor substrates and the like.

It is another object of the present invention to provide a method for high rate plasma processing while not requiring supplemental cooling of a radiation transmissive window or adjacent portion of the processing chamber.

It is yet another object of the invention to provide a method for high rate plasma processing while reducing the likelihood of contamination during processing as may typically be caused by a plasma etching the window or adjacent interior surface portions of the processing chamber.

These and other objects according to the invention are provided by generating a relatively high magnetic field in a processing chamber at relatively high pressure to thereby produce a first plasma region adjacent the chamber window having a lower radiation absorption than a second plasma region adjacent a substrate holder within the chamber. The magnetic field in the second plasma region is lower than in the first region as may be readily achieved by providing one or more electromagnets adjacent the window of the chamber, since the field strength decreases with increasing distance from the electromagnets.

Microwave radiation is coupled through the window and into a processing gas within the chamber to create the plasma. The direction of the magnetic field is generally parallel to the direction of propagation of the radiation. The frequency of the microwave radiation is preferably in the range of about 900 MHz to 15 GHz as is readily achievable using conventional microwave generators.

The plasma region adjacent the window is relatively cool so that the window and adjacent portion of the chamber may not require water cooling, for example. Moreover, the plasma region adjacent the window is also less likely to cause etching of the window material and thereby introduce contaminants into the processing chamber during processing.

The relatively high pressure of the processing gas permits high deposition rates to be achieved to speed production throughput. The pressure is preferably greater than about 10 Torr, and more preferably greater than about 100 Torr. The magnetic field strength adjacent the window is preferably about 3000 Gauss, and more preferably greater than about 5000 Gauss. The magnetic field strength required is related to the pressure of the process gas. For a pressure of about 10 Torr, the magnetic field strength in the first plasma region adjacent the window is preferably about 3000 Gauss. For a pressure of about 100 Torr, the magnetic field strength is preferably about 5000 Gauss. Other relatively high pressures will require corresponding relatively high magnetic fields. These relatively high pressures and magnetic fields are in sharp contrast to the relatively low pressures and low magnetic fields used in conventional ECR systems.

According to another aspect of the present invention, a sufficiently high magnetic field is generated in a processing chamber at sufficiently high pressure to produce a radiation absorption region in the processing chamber having a predetermined thickness which is on the order of centimeters. The thick absorption region, for example, between about 1–10 centimeters in thickness, permits high processing throughput and uniform processing to take place.

Preferably, a uniform magnetic field is generated across the predetermined thickness of the radiation absorption region to produce uniform absorption across the thickness of the region. The uniform magnetic field strength in the absorption region is preferably greater than about 2000 Gauss and more preferably greater than about 3500 Gauss. As was described above, the magnetic field strength required is related to the pressure of the process gas. For a pressure of about 10 Torr, the uniform magnetic field strength in the thick absorption region is preferably at least about 2000 Gauss. For a pressure of about 100 Torr, the magnetic field strength in the thick absorption region is preferably at least about 3500 Gauss. The thick absorption region on the order of centimeters in thickness, is in sharp contrast to the thin absorption region, on the order of millimeters, which is formed in conventional non-magnetic systems.

DESCRIPTION OF THE PREFERRED EMBODIMENTS

The present invention will now be described more fully hereinafter with reference to the accompanying drawings, in which preferred embodiments of the invention is shown. This invention may, however, be embodied in many different forms and should not be construed as limited to the embodiments set forth herein. Rather, applicants provide these embodiment so that this disclosure will be thorough and complete, and will fully convey the scope of the invention to those skilled in the art. Like numbers refer to like elements throughout. The thickness of regions are exaggerated for ease of understanding.

Figure 1:
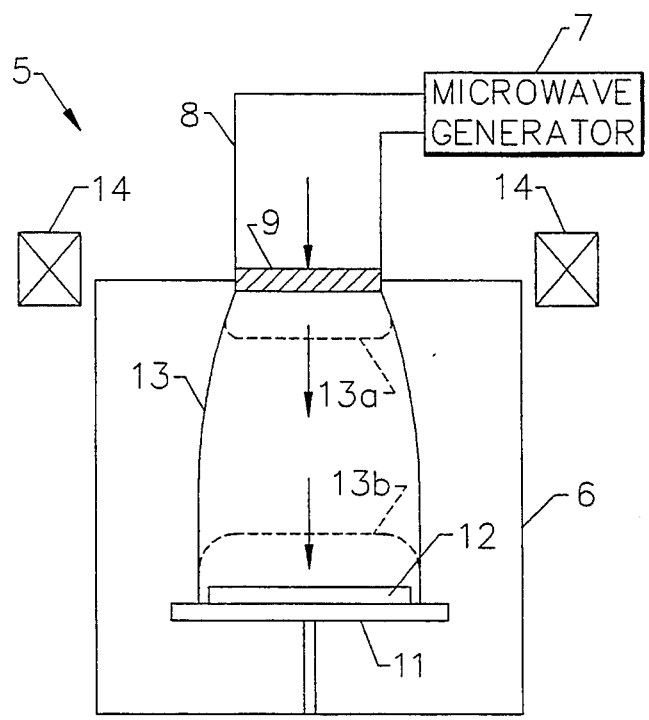
FIG. 1 is a schematic view of a plasma processing apparatus illustrating a method according to the invention.

Referring now to the schematic diagram of FIG. 1, a plasma processing apparatus 5 for practicing the method according to the invention will now be described. The apparatus 5 includes an evacuable processing chamber 6 of a conventional type. A feed or process gas may be introduced into the processing chamber 6 at a predetermined pressure through conventional feed ports, not shown.

A microwave generator 7 is coupled to the processing chamber 6 via a waveguide 8. The microwave generator 7 preferably couples electromagnetic radiation of a predetermined frequency through a radiation transmissive window 9 and into the chamber 6 in the direction generally normal to the window 9 as indicated by the arrows shown in the illustrated embodiment. The radiation creates a plasma 1 from the process gas within the chamber. The microwave generator 7 is preferably operated in the frequency range of about 900 MHz to 15 GHz.

A substrate holder 11 of a conventional type is positioned within the chamber 6 in spaced apart relation from the window 9. A semiconductor substrate 12 or other suitable object may be positioned on the substrate holder 11 for plasma assisted etching or deposition as would be readily understood by those skilled in the art.

One or more electromagnets 14 are positioned outside of the chamber 6 adjacent the window 9. The electromagnets 14 generate a magnetic field in a direction generally parallel to the direction of radiation propagation. The electromagnets 14 preferably are one or more coils, coaxial to the chamber, for generating a magnetic field within the chamber. The magnetic field has a first predetermined field strength in a first plasma region 13a adjacent the window, and a second lower predetermined strength in a second region of the plasma 13b adjacent the substrate holder 11.

The method according to the present invention creates a first plasma region 13a adjacent the window 9 of the apparatus 5 having lower absorption, or lower damping, of the radiation. Accordingly, the first plasma region 13a is cooler than the second plasma region 13b adjacent the substrate 12. Therefore, supplemental cooling of the window 9 is typically not required and overall energy efficiency of the apparatus 5 is increased. Moreover, the process chemistry is less likely to be contaminated from atoms etched from the window 9 or adjacent surfaces of the chamber 6 by a hot plasma. On the other hand, a hot plasma 13b is created in the second plasma region 13b adjacent the substrate 12 to thereby increase the processing rate.

While two discrete regions of the plasma are illustrated, it would be readily understood by those skilled in the art that with a gradually decreasing magnetic field, the radiation absorption of the plasma would also gradually increase within the plasma in the direction from the window 9 to the substrate 12.

The method according to the present invention is carried out at relatively high pressures, that is, preferably greater than 10 Torr, and more preferably at 100 Torr or more. The method may even be practical at atmospheric pressure to thereby create even higher plasma densities. In order to create the first and second plasma regions 13a, 13b, respectively, much higher magnetic fields than those used in conventional ECR systems are needed. More particularly, for a pressure of 10 Torr, the magnetic field in the first plasma region 13a is desirably about 3000 Gauss. This is in sharp contrast to the relatively low magnetic fields, typically less than 1000 Gauss, as used in conventional ECR systems. For a pressure of the process gas of 100 Torr, the magnetic field strength in the first plasma region 13a is desirably about 5000 Gauss according to the invention.

By positioning the electromagnets 14 adjacent the first plasma region 13a, a higher magnetic field strength is created therein, while a lower magnetic field strength is generated in the second plasma region 13b adjacent the substrate 12. In other words, the electromagnets 14 create a decreasing magnetic field strength with increasing spacing from the window 9. Accordingly, the plasma 13 has a lower radiation absorption in the first plasma region 13a wherein the magnetic field is higher, and the plasma has a higher radiation absorption in the second plasma region 13b wherein the magnetic field is lower.

Figure 2:
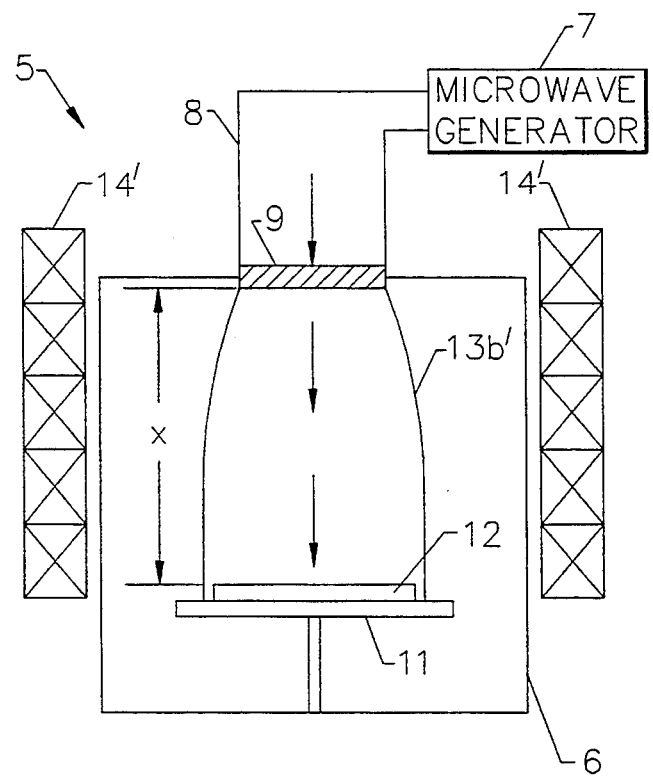
FIG. 2 is a schematic view of a plasma processing apparatus illustrating an alternative method according to the invention.

Referring now to FIG. 2, an alternative embodiment of a plasma processing apparatus for practicing a method according to the invention will now be described. As shown, plasma processing apparatus 5 includes one or more electromagnets 14' which are positioned outside of the chamber 6 and preferably extend from the window 9 to the substrate holder 11 to create a magnetic field in the chamber therebetween. The electromagnets 14' are preferably one or more coils, coaxial to the chamber, for generating a magnetic field within the coils. As shown, radiation absorption region 13b' is created in the chamber. The predetermined thickness "x" of region 13b' from the window 9 to the substrate holder 11 is on the order of centimeters. Preferably a thickness of between 1-10 centimeters, and more preferably between 5-10 centimeters is provided. This contrasts sharply with known plasma processing systems wherein the absorption region has a thickness on the order of millimeters. Magnets 14' preferably generate a uniform magnetic field along thickness "x" so that the plasma density in the region 13b' is uniform. Uniform processing across the face of substrate 12 is thereby provided, along with high throughput.

As was described above, the method of FIG. 2 is carried out at relatively high pressures, that is, preferably greater than 10 Torr, and more preferably at 100 Torr or more. The method may even be practical at atmospheric pressure to thereby create even higher plasma densities. For a pressure of 10 Torr, the uniform magnetic field in absorption region 13b' is desirably about 2000 Gauss. For a pressure of the processed gas of 100 Torr, the magnetic field strength 13b' is preferably about 3500 Gauss according to the invention. Other relatively high pressures will require corresponding relatively high magnetic fields to create an absorption region having a predetermined thickness which is on the order of centimeters.

The methods according to the present invention are further understood by the following technical discussion which sets forth an analysis of plasma generation under various conditions, including generation of a plasma using a relatively high pressure and a high magnetic field. In the technical discussion which follows, the definitions shown in Table 1 are used:

TABLE 1

| | |
|---|---|
| $\vec{B}$ | magnetic field |
| $\vec{v}_i$ | ion velocity |
| $\vec{v}_e$ | electron velocity |
| $\vec{j}$ | current density |
| | conductivity tensor |
| $\vec{E}$ | electric field |
| $\vec{V}$ | velocity of particle |
| C | speed of light |
| $B_o$ | magnetic field |
| | mobility tensor |
| | dielectric tensor |
| $i$ | $\sqrt{-1}$ |
| $\vec{K}$ | wave propagation vector |
| $\vec{r}$ | position vector |
| $\omega$ | angular frequency of wave |

TABLE 1-continued

| | |
|---|---|
| t | time |
| m | mass of particle |
| $v_c$ | collision frequency |
| $v_e$ | electron collision frequency |
| $v_i$ | ion collision frequency |
| n | index of refraction |
| $\omega_{pe}$ | electron plasma frequency |
| $\omega_{pi}$ | ion plasma frequency |
| e | charge of electron |
| $n_e$ | electron density |
| $n_i$ | ion density |
| $k_r$ | real part of wavenumber |
| $k_i$ | imaginary part of wavenumber |
| d | skin depth ($= 1/R_i$) |
| $\omega_{ce}$ | electron cyclotron frequency |
| $\omega_{ci}$ | ion cyclotron frequency |
| r | radius |
| b | RF magnetic field |
| $H_B$ | hydrogen $\beta$ line (481.6 nm) |
| V | voltage |
| $\Phi_B$ | magnetic flux |
| N | number of turns in loop |
| A | area of loop |

TECHNICAL DISCUSSION

Wave Propagation in the Absence of a Magnetic Field

The present invention involves wave propagation in the presence of a magnetic field. However, in order to describe wave propagation in the presence of a magnetic field, wave propagation in the absence of a magnetic field will first be described.

To a great extent the operating range and dimensions of radio frequency (RF) and microwave excited industrial plasmas without magnetic enhancement are determined by the skin-depth limitations of the electromagnetic radiation penetration. If the plasma dimensions are significantly larger than the skin depth, for example, the interior regions of the plasma will tend to be cool, especially at high pressures where diffusion away from the hot surface is limited by collisions.

The following description explores the relationship between the so-called inertial and collisional skin depths in plasmas with no magnetic field enhancement. The purpose of this description is to give an example of the transition from collision-free to collision-dominated plasmas for the relatively simple case with $\vec{B}=0$. The cold plasma model developed in detail by T. H. Stix in The Theory of Plasma Waves, McGraw-Hill, 1962 is used, however, the effects of collisions of electrons and ions with the neutral gas atoms and molecules are also included.

To understand power absorption and wave propagation in a plasma, one can solve Maxwell's equations together with the equations for the particle drive velocities, $\vec{v}_i$ and $\vec{v}_e$ or equivalently the current density, $\vec{j}$. This is a very common general procedure in plasma physics, but it described with a variety of terminology which may render obscure the simple strategy of reducing the number of unknown quantities down to the number of independent equations. Whether solving for the conductivity in $\vec{j} = \vec{\sigma} \cdot \vec{E}$ the mobility tensor in $$v = \frac{c}{B_0} \overleftrightarrow{\mu} \cdot E,$$

or the dielectric tensor in $$c\nabla \times B = 4\pi j + \frac{\partial E}{\partial t} - \frac{\partial \cdot E}{\partial t} \quad (1)$$

the goal is to obtain $\vec{j}$ in terms of $\vec{E}$ so that the Faraday and Ampere-Maxwell law equations can be solved.

Stix takes the approach of solving for the dielectric tensor components for a cold plasma consisting of an arbitrary number of particle species, each with a different charge to mass ratio. To zero order the magnetic fields and particle densities are assumed not to vary in space or time. The wave associated, first-order quantities are assumed to vary as $\exp(i(\vec{k}\cdot\vec{r}-\omega t))$. This formalism is adopted, but, for simplicity, a two component plasma consisting of electrons and one species of positive singly charged ions will be considered. In addition, included are the effects of collisions of the ions and electrons with the neutral gas atoms and molecules.

In this collection of equations solved by Stix, the mass of a given particle type appears only in the equation of motion.

$$m\frac{dv}{dt} = -i\omega m v = eE + \frac{v \times B_0}{c} \quad (2)$$

Although he does not include the effects of collisions, Stix points out that substituting $$m\left(1 + i\frac{\nu_c}{\omega}\right) \quad (3)$$

for the mass in Equation 2 transforms the equation to $$m\frac{dv}{dt} - m\nu_c v = eE + \frac{v \times B_0}{c} \quad (4)$$

and equation appropriate for charged particles experiencing a collision frequency, $\nu_c$, with neutral gas particles. This substitution makes no change in the mathematical formalism, which means that one can take the solutions from the collision-less model and, by making the above substitution with the appropriate collision frequency for each particle, include the effect of collisions. From the cold plasma, collision-less model one finds all of the well known electromagnetic modes of plasma physics including, for example, the Alfven waves, ion and electron cyclotron waves, whistlers, and so forth. Now, for each of these wave modes, one can find the extent of wave damping caused by plasma-particle neutral-particle collisions by simply replacing the mass with the "complex mass" of Equation 3.

As an illustration of this approach, the propagation of a wave in a plasma with no magnetic field is considered. The index of refraction in the collision-less case is given by $$n^2 = \frac{k^2 c^2}{\omega^2} = 1 - \frac{\omega_{pe}^2 + \omega_{pi}^2}{\omega^2} \quad (5)$$

where the electron and ion plasma frequencies are $$\omega_{pe}^2 = \frac{4\pi n_e e^2}{m_o}, \quad \omega_{pi}^2 = \frac{4\pi n_i e^2}{m_i} \quad (6)$$

If we make the substitutions $$m_{i,e} = m_{i,e}\left(1 + i\frac{\nu_{i,e}}{\omega}\right) \quad (7)$$

onto the index of refraction we find that $n^2$ and $k^2$ are complex, i.e.

$$n^2 = \frac{k^2 c^2}{\omega^2} = \frac{c^2}{\omega^2}(k_r + k_i)^2 = X + iY \quad (8)$$

where $$X = 1 - \left(\frac{\omega_{pe}^2}{\omega^2 + \nu_e^2} + \frac{\omega_{pi}^2}{\omega^2 + \nu_i^2}\right), \quad (9)$$

$$Y = \frac{1}{\omega}\left(\frac{\omega_{pe}^2 \nu_e}{\omega^2 + \nu_e^2} + \frac{\omega_{pi}^2 \nu_i}{\omega^2 + \nu_i^2}\right)$$

Taking the square root yields the real and imaginary parts of k, producing:

$$k_r = \frac{\omega}{c}\left(\frac{(X^2 + Y^2)^{\frac{1}{2}} + X}{2}\right)^{\frac{1}{2}}, \quad (10)$$

$$k_i = \frac{\omega}{c}\left(\frac{(X^2 + Y^2)^{\frac{1}{2}} - X}{2}\right)^{\frac{1}{2}}$$

where $k_i$ is the reciprocal of the skin depth. Based upon this relationship, it would appear that one could achieve arbitrarily large skin depths by increasing the collision frequency through high pressure operation. In practice, however, the electron density will increase with the plasma pressure and the skin depth will tend to stay constant. For values of $\nu_c << \omega$, one finds $k_i = \omega_{pe}/C$ which gives the inertial skin depth, and $k_r$ 0. In this case the wave amplitude decreases with no power absorption and is evanescent. A familiar example of evanescence is the spatial decrease in wave amplitude of microwaves in a waveguide below the cut-off frequency. The relationship also illustrates the transition near $\nu_e/\omega = 1$ from the collision-less, inertial skin depth $$d = \frac{c}{\omega_{pe}} \quad (11)$$

to the collisional skin depth $$d = \left(\frac{2\nu_e}{\omega}\right)^{\frac{1}{2}} \frac{c}{\omega_{pe}} \quad (12)$$

The above equations hold for collision-less and collision-dominated plasmas, and there is no limit on the ratio $\omega_{pe}/\omega$. Thus, for example, these equations describe the propagation of RF, microwaves, infra-red, visible light, etc. in collisional and, to some extent, collision-less plasmas. They are valid in collision-less plasmas only if Landau damping and cyclotron damping can ignored.

In general, microwave and RF driven industrial plasmas are in the collision dominated regime, and the transfer of energy to the plasma is optimized when the skin depth is of the order of and slightly less than the plasma length.

Magnetically Enhanced Wave Propagation

The possibility of increasing the skin depth and operating range of plasmas through the application of magnetic field is now considered relating to wave propagation in collisional, dense plasmas. Such plasma are typically generated using RF or microwave power. In general, therefore, $\omega << \omega_{pe}$ since we are considering plasmas with densities above $10^{14} cm^3$ and corresponding plasma frequencies above 100 GHz.

Two special cases are described: propagation perpendicular to $\bar{B}$ at frequencies near $(\omega_{ce}\varepsilon_{ci})^{\frac{1}{2}}$, and propagation parallel to $\bar{B}$. The frequency $(\omega_{ce}\omega_{ci})^{\frac{1}{2}}$ is the lower hybrid resonance for plasmas with $\omega_{pe} >> \omega_{ce}$. It is hybrid of the electron and ion cyclotron frequencies.

$$\omega_{ce,i} = \frac{eB}{m_{e,i}c} \qquad (13)$$

Under certain conditions the RF driven ICP geometry is effective in launching waves which propagate perpendicular to a magnetic field aligned parallel to the plasma column axis. Roughly, the propagation vector $\bar{k}$ is perpendicular to $\bar{B}$ if the radial wavelengths in the plasma are much shorter than the length of the induction coil.

Regarding parallel propagation, the transmission of microwaves parallel to $\bar{B}$ is one of the most effective methods of penetrating plasmas when $\omega << \omega_{pe}$. This is the standard geometry for the generation of the whistler mode in electron cyclotron resonance (ECR) plasmas.

Propagation Across the Magnetic Field

It will be understood by those having skill in the art that propagation of microwave power parallel to $\bar{B}$ is used according to the present invention. However, as an aid to understanding the present invention, propagation across the magnetic field will first be described.

Now considered in greater detail are the effects of collisions on electromagnetic waves propagating perpendicular to a magnetic field. This is the geometry related to magnetic enhancement of inductively coupled plasmas (ICP's). As in the case for B=0, the analysis begins with the collision-less index of refraction.

$$n^2 = \frac{\omega_{pe}^2 + \omega_{pi}^2}{\omega_{ce}\omega_{ci} - \omega^2}, \text{ for } \omega << \omega_{pe} \qquad (14)$$

The collision-less wave passes from evanescence to propagation at $\omega = (\omega_{ce}\omega_{ci})^{\frac{1}{2}}$, the lower hybrid resonance. With collisions, the complex index of refraction becomes $$n^2 = \frac{(\omega_{pe}^2 + \omega_{pi}^2) + i\left(\frac{\nu_i}{\omega}\omega_{pe}^2 + \frac{\nu_e}{\omega}\omega_{pi}^2\right)}{(\omega_{ce}\omega_{ci} - \nu_e\nu_i - \omega^2) - i\omega(\nu_e + \nu_i)} \qquad (15)$$

Again, this can be solved for $k_r$ and $k_i$ to give the wavelength and skin depth of the wave, respectively. The basic result is that the lower hybrid resonance is damped out as the electron and ion collision frequencies become large compared to the wave frequency. Note that this expression scales differently with collision frequency than the B=0 result. Here, since $\nu_i\omega_{pe} >> \nu_e\omega_{pi}$, the ion collision frequency plays a more important role than in the case without a magnetic field (compare to Equation 9).

The effects of a magnetic field on an inductively coupled plasma (ICP) were studied in 1957 by Stix in Oscillations of a Cylindrical Plasma, Physics Review, Vol. 106, page 1146 (1957, who was interested in ion heating with wave modes at $\omega \leq \omega_{ci}$. The existence of ICP's driven by modes with $\omega \geq \omega_{ci}$ was demonstrated in 1962 by Hooke et al in Measurements on the Fast Hydromagnetic Wave Above the Ion Cyclotron Frequency, Journal of Physics and Fluids, Volume 5, p. 864., and in recent years P. Zu and R. Boswell in A New Argon Ion Laser Based on an Electrodeless Plasma, Applied Physics Journal, Volume 61, p. 1981 (1990) who worked in the area of ICP's with magnetic fields for semiconductor processing. The above experiments combining ICP's with magnetic fields are all in the relatively collision-less, $\omega >> \nu$, regime.

Effects of a Magnetic Field in the Transitional Region

In the description below, the effects of a magnetic field on an ICP are considered in the transition regime between collisional and collision-less plasmas. The pressures considered are higher than those reported in the preceding experiments by a factor of about 100 to 1000. Of interest are any magnetic field effects which enhance the wave penetration beyond the usual collisional skin depth.

There are two refinements desirable to make the wave propagation model discussed above more closely resemble an experimental case. These are consideration of the cylindrical geometry of the ICP and consideration of the radial density variation. For an infinite, symmetric cylinder the wave equation leads to $$\frac{1}{r}\frac{d}{dr}\left(\frac{r}{\sigma(r)}\frac{db}{dr}\right) - \frac{4\pi i\omega}{c^2}b = 0 \qquad (16)$$

as the differential equation for the magnetic field of the wave as a function of position, b(r). This equation is discussed by Frommelt and Jones in The Use of Magneto-Acoustic Oscillations as a Plasma Diagnostic Technique, Journal of Plasma Physics, Volume 14, pages 373–387 (1975), who used it to analyze work done at lower pressure than the present experiments. For a uniform plasma, the solution of this equation, b(kr), has the form of a Bessel function of complex argument.

Experimental work has involved both wave propagation at B=0 and across B in an inductively coupled plasma. For this experimental system, it was attempted to verify qualitatively the behavior described above and to determine the values of collision frequency which damp out the effect. In addition it was hoped to determine the implicit dependence of collision frequency on gas pressure and input power. Presently, the ICP operates in argon at pressures of 0.1 to 100 Torr, for which it was estimated electron collision frequencies of 1e7 to 1e10. The RF power available was 3 kW at 13.56 MHz, which generated densities to 1e 15 $cm^{-3}$. The magnetic field was produced by a pair of coils generating a field up to 3.5 kG. Thus B could be set directly, $\nu$ indirectly via pressure, and $n_e$ indirectly via pressure and power.

The regime of the experiment can be described in terms of the frequencies detailed above: $\nu_e$, $\nu_i$, $\omega_{ce}$, $\omega_{ci}$, $\omega_p$ and $\omega$.

The relevant ratios of these frequencies are as follows:

$$\frac{\omega_p}{\omega} \gg 1, \quad 0.1 < \frac{\nu_e}{\omega} < 100, \quad 0 < \frac{\omega_{ce}}{\nu_c} < 600, \quad 0 < \frac{\omega_{ei}}{\nu_i} < 1 \quad (17)$$

These include the region $\omega = (\omega_{ce}\omega_{ci})^{\frac{1}{2}}$, and allow us to study conditions where the electrons are magnetized, but the ions, in general, are not magnetized. Thus we are exploring magnetically enhanced wave penetration near the lower hybrid frequency. Since the damping parameters are of order unity, we are in the region where one expects the transition from heavy damping to free propagation.

To test the model, it was necessary to measure both the electron density and the propagation vector $\bar{k}$. The density was measured via Stark line broadening as described in Plasma Spectroscopy by Greim, McGraw-Hill, 1964. The width of the $H_\beta$ atomic emission line is proportional to the temperature and electron density of the plasma, but, for densities above about 1e14, the width is relatively insensitive to temperature. For the cylindrically symmetric ICP, one can make simultaneous spatially resolved emission measurements by using a two dimensional detector (such as charge coupled device (CCD)) and performing an Abel inversion on the data as discussed in An Instrumental System for Simultaneous Measurement of Spatially Resolved Electron Number Densities in Plasmas, Olesik et al, Applied Spectroscopy, Volume 43, page 824 (1989). Both line average and spatially resolved linewidth measurements were made using 0.67 and 1.0 m McPherson monochromomators fitted with a 3600 g/mm grating and a thermoelectrically cooled CCD (Princeton Instruments TE576-MPPUV) as the detector.

The amplitude and phase of the wave are measured by an RF probe similar to the one described by Eckert in Measurement of the RF Magnetic Field Distribution in a Thermal Induction Plasma, Journal of Applied Physics, Vol. 42, pages 3108–3113 (1971). Essentially, such a probe consists of a number of turns of wire in a loop; the time-varying magnetic field of the wave includes a voltage across the loop according to Faraday's law.

$$V = \frac{d\Phi_\beta}{dt} = NA\omega b \quad (MKS \text{ units}) \quad (18)$$

To reduce the capacitive signal which is also present, the voltage difference across the loop was measured with an oscilloscope (LeCroy 9140 DSO). Triggering the oscilloscope on the RF generator's output allows one to measure the relative phase of the wave in addition to the amplitude. The probe was placed in the ICP via an entrant tube which passes through the quartz chamber and was open to air. Moving the RF probe through the plasma via this entrant tube gave $b_z(r)$.

Based on preliminary results with and without the plasma (no magnetic field), a strong dip in the presence of the plasma was found due to the RF absorption, while steepness of the drop was related to the skin depth. A relatively small discrepancy between theory and experimental data was believed due to density gradients, which were not considered in the calculation. The damping of the wave amplitude was observed to increase with electron density, as predicted by the model.

At 2 Torr, $n_e$ was unchanged with magnetic field, but the wave amplitude rose significantly at the center of the plasma, consistent with a decrease in damping. The enhancement of propagation as a function of magnetic field became much more pronounced above the lower hybrid frequency (for 13.6 MHz and in argon, the lower hybrid was at 1320 gauss).

Propagation Along the Magnetic Field

We now return to the case of wave propagation parallel to the magnetic field according to the present invention. An example of an approximation to this idealized configuration is a low pressure ECR system. The simple collisional model gives the index of refraction for this case.

$$n^2 = 1 - \frac{1}{\omega}\left(\frac{\omega_{pe}^2(\omega - \omega_{ce})}{(\omega - \omega_{ce})^2 + \nu_e^2} + \frac{\omega_{pi}^2(\omega + \omega_{ci})}{(\omega + \omega_{ci})^2 + \nu_i^2}\right) + \quad (19)$$

$$\frac{i}{\omega}\left(\frac{\omega_{pe}^2 \nu_e}{(\omega - \omega_{ce})^2 + \nu_e^2} + \frac{\omega_{pi}^2 \nu_i}{(\omega + \omega_{ci})^2 + \nu_i^2}\right)$$

Before discussing the effects of the collisions, it is illuminating to consider the case of a collision-less plasma specialized to the frequency range $\omega_{ei} \ll \omega \ll \omega_{ce}$ and assuming $\omega_{pi} \ll \omega_{pe}$. In this case the collision-less index of refraction reduces to $$n^2 = \frac{\omega_{pe}^2}{\omega\omega_{ce}} = \frac{4\pi n_e ec}{\omega B} \quad (20)$$

This is the simplest possible zero order dispersion relation for the whistler mode. An unusual aspect of the dispersion relation is that it is independent of the electron and ion masses. This lack of mass dependence suggests that to the order of the above stated approximations there will be no damping, even if we take collisions into account, since the complex mass would not enter into the dispersion relation. In fact, as we shall see, damping does occur, but the parametric dependence of the attenuation is different from the other waves considered above.

Figure 3:
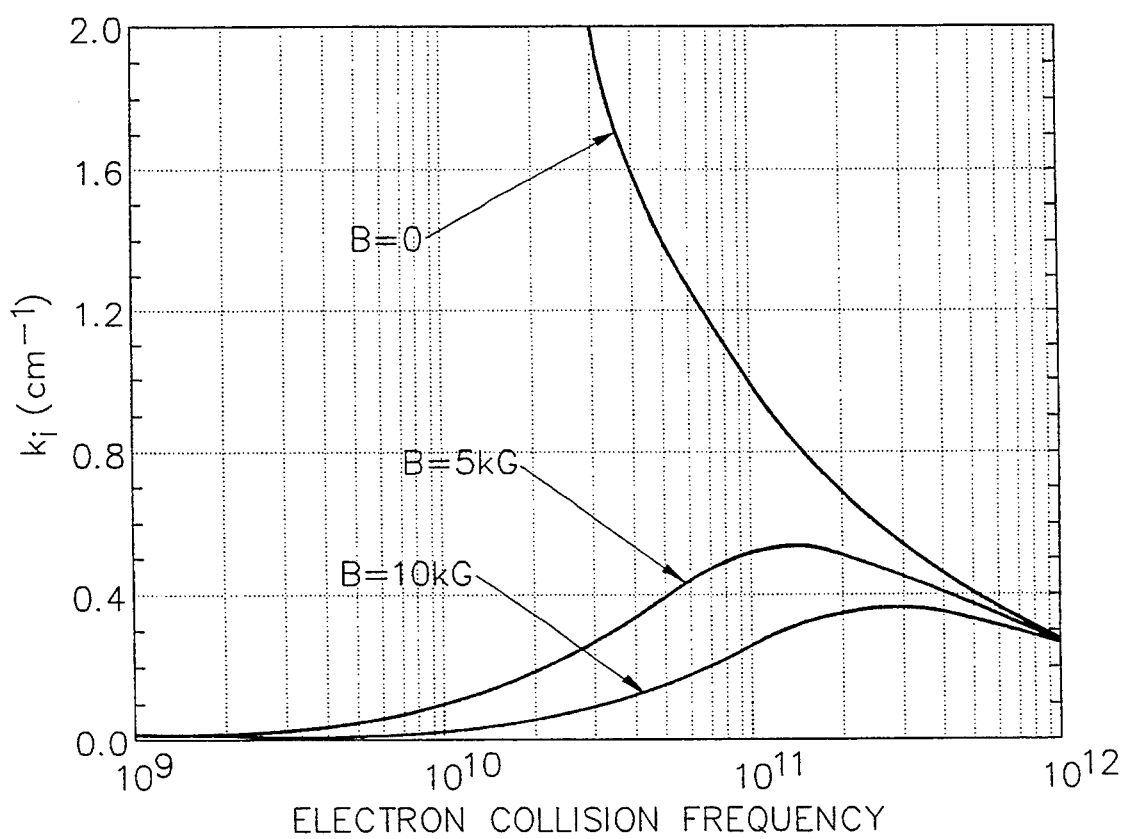
FIG. 3 is a graph showing the relationship of several processing variables relating to the method of the present invention.

The imaginary part of the wave vector is plotted in FIG. 3. One can see that the attenuation $k_i$ is small even when $\nu_e/\omega > 1$; the factor determining the damping is in fact, $\nu_e/\omega_{ce}$. This surprising result is a basis for the method according to the present invention. Accordingly, one can generate and heat large, dense, collisional plasmas without the usual $\nu_e/\omega < 1$ limitations. It is expected that one could achieve magnetically aided wave heating even for plasmas approaching atmospheric pressure.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. A method for plasma processing in a processing chamber including a radiation transmissive window and a substrate holder positioned within the chamber in spaced relation from the window, the method comprising the steps of:

supplying a process gas within the processing chamber at a relatively high pressure of greater than about 10 Torr;

coupling radiation through the window to define a predetermined direction of propagating radiation through the process gas and thereby generate a plasma in a region between the window and the substrate holder so that the plasma includes a radiation absorption region extending in the predetermined direction of propagating radiation; and increasing a thickness of the radiation absorption region in the plasma to a thickness greater than about one centimeter by generating a relatively high magnetic field of greater than about 2000 Gauss throughout an entire interior volume of the processing chamber defined from a surface of the window to a surface of the substrate holder and throughout the entire plasma in the region extending between the window and the substrate holder.

2. A method according to claim 1 wherein the step of supplying the process gas at a pressure greater than about 10 Torr comprises supplying the process gas at a pressure greater than about 100 Torr.

3. A method according to claim 2, wherein the step of generating a magnetic field at a strength greater than about 2000 Gauss throughout the entire plasma comprises generating the magnetic field at a strength greater than about 3500 Gauss throughout the entire plasma.

4. A method according to claim 1 wherein the step of coupling radiation through the window comprises the steps of generating microwave radiation at a predetermined frequency and coupling the microwave radiation to the window of the chamber.

5. A method according to claim 4 wherein the step of generating microwave radiation at a predetermined frequency comprises generating microwave radiation at a frequency in the range of about 900 MHz to about 15 GHz.

6. A method according to claim 1 wherein the step of generating the magnetic field comprises positioning at least one magnet outside of the chamber so as to produce a uniform magnetic field along the radiation absorption region.

7. A method according to claim 1 wherein the step of generating the magnetic field comprises positioning at least one magnet outside of the chamber so as to produce a uniform magnetic field in the direction of radiation propagation, from said window to said substrate holder.

8. A method according to claim 1 wherein the step of increasing the thickness of the radiation absorption region comprises increasing the thickness to less than about 10 centimeters.

9. A method according to claim 1 wherein the step of increasing the thickness of the radiation absorption region comprises increasing same to a thickness in the range of about 5 to 10 centimeters.

* * * * *